(12) United States Patent
Ghoshal

(10) Patent No.: US 6,221,707 B1
(45) Date of Patent: Apr. 24, 2001

(54) METHOD FOR FABRICATING A TRANSISTOR HAVING A VARIABLE THRESHOLD VOLTAGE

(75) Inventor: Uttam Shyamalindu Ghoshal, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/282,271

(22) Filed: Mar. 31, 1999

(51) Int. Cl.[7] .................................................. H01L 21/8238
(52) U.S. Cl. ........................ 438/199; 438/197; 438/217; 438/154
(58) Field of Search .................................... 438/199, 217, 438/527, 529, 154, 197

(56) References Cited

U.S. PATENT DOCUMENTS 4,364,778 * 12/1982 Leamy et al. ........................ 148/1.5
6,096,611 * 8/2000 Wu ........................................ 438/289

* cited by examiner

Primary Examiner—Matthew Smith
Assistant Examiner—Craig P. Lytle
(74) Attorney, Agent, or Firm—Casimer K. Salys; Felsman, Bradley, Vaden, Gunter & Dillon, LLP

(57) ABSTRACT

A method for fabricating a transistor having a variable threshold voltage is disclosed. Energy levels of a transistor can be represented by a valance band, a conduction band, and a Fermi level. In order to fabricate a transistor with a variable threshold voltage, a region of the transistor is initially doped with a first dopant having a first energy level below the Fermi level. The region of the transistor is subsequently doped with a second dopant having a second energy level above the Fermi level. Alternatively, the region of the transistor can be initially doped with a first dopant having a first energy level above the Fermi level, and then the region of the transistor can be subsequently doped with a second dopant having a second energy level below the Fermi level.

14 Claims, 3 Drawing Sheets

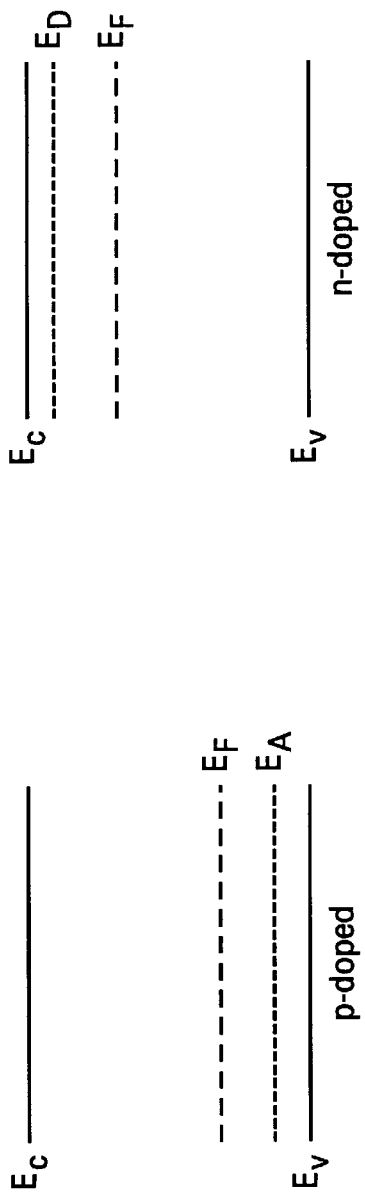
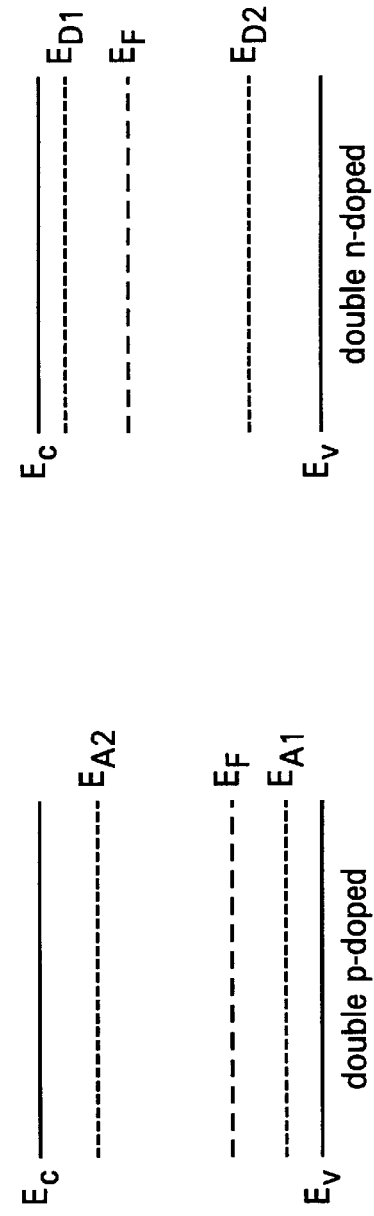
Fig. 2a Prior Art
Fig. 2b Prior Art
Fig. 3a
Fig. 3b

METHOD FOR FABRICATING A TRANSISTOR HAVING A VARIABLE THRESHOLD VOLTAGE

BACKGROUND OF THE INVENTION

1. Technical Field

The present invention relates to integrated circuits in general, and in particular to a method for fabricating transistors within an integrated circuit. Still more particularly, the present invention relates to a method for fabricating transistors having an variable threshold voltage.

2. Description of the Prior Art

A metal oxide semiconductor field effect transistor (MOSFET) or MOS transistor has two regions in a silicon substrate, namely, a source and a drain, which are disposed at a certain distance from each other. The MOS transistor also has an insulated gate disposed between the source and the drain. The gate is characterized by a threshold voltage ($V_{TH}$) that determines the boundary between an ON state and an OFF state in the drain current.

It is well-known in the art that the threshold voltage of a MOS transistor changes as a function of temperature due to the availability of mobile electrons and other factors. Generally speaking, the threshold voltage decreases as temperature increases, or alternately, the threshold voltage increases as the temperature decreases. Because of the temperature dependence of the threshold voltage, the design of an integrated circuit having millions of MOS transistors that are capable of operating over a wide temperature range is a challenging task.

Many attempts have been made to adjust the threshold voltage of a MOS transistor such that the operating temperature range of the MOS transistor can be extended. One such attempt is to bias the body of the MOS transistor at a higher voltage level. However, biasing requires a biasing source to contact the body of the MOS transistor, which results in a much larger circuit than normally desired. The threshold voltage of a MOS transistor can also be adjusted by changing the doping concentrations within the substrate and wells in which the MOS transistor is located. However, this alteration can only accommodate for temperature changes within a small range. Therefore, it should be appreciated that there is a need to control the threshold voltage of MOS transistors within an integrated circuit in order to compensate for a wide operating temperature range.

SUMMARY OF THE INVENTION

In accordance with a preferred embodiment of the present invention, the energy levels of a transistor can be represented by a valance band, a conduction band, and a Fermi level. In order to fabricate a transistor with a variable threshold voltage, a region of the transistor is initially doped with a first dopant having a first energy level below the Fermi level. The region of the transistor is subsequently doped with a second dopant having a second energy level above the Fermi level. Alternatively, the region of the transistor can be initially doped with a first dopant having a first energy level above the Fermi level, and then the region of the transistor can be subsequently doped with a second dopant having a second energy level below the Fermi level.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 2a is an energy band diagram of the p-doped material of an n-channel transistor, according to the prior art;

FIG. 2b is an energy band diagram of the n-doped material of a p-channel transistor, according to the prior art;

FIG. 3a is an energy band diagram of the p-doped material of an n-channel transistor, in accordance with a preferred embodiment of the present invention;

FIG. 3b is an energy band diagram of the n-doped material of a p-channel transistor, in accordance with a preferred embodiment of the present invention.

DETAILED DESCRIPTION OF A PREFERRED EMBODIMENT

Figure 1:
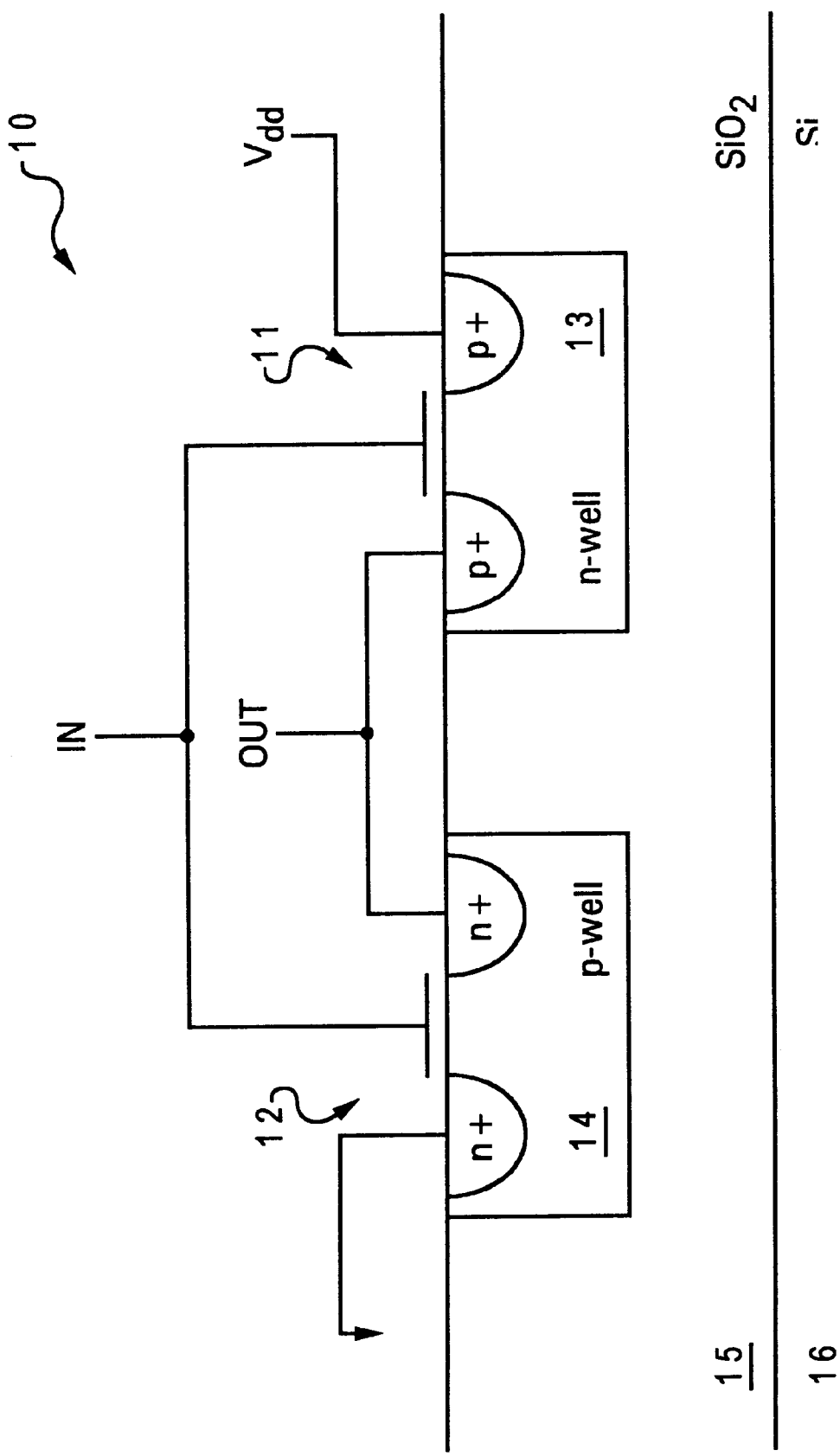
FIG. 1 is a cross-sectional view of a complementary metal oxide semiconductor inverter in which a preferred embodiment of the present invention is incorporated.

Referring now to the drawings and in particular to FIG. 1, there is depicted a cross-sectional view of a complementary metal oxide semiconductor (CMOS) invertor in which a preferred embodiment of the present invention can be incorporated. As shown, a CMOS invertor 10 includes a p-channel transistor 11 located within an n-well 13, and an n-channel transistor 12 located within a p-well 14. Both n-well 13 and p-well 14 are formed by isolating silicon islands at selective locations on a silicon-on-insulator (SOI) wafer 16 by silicon dioxide 15.

With reference now to FIG. 2a, there is illustrated an energy band diagram of the p-doped material of n-channel transistor 12, according to the prior art. As shown, $E_V$, $E_C$, $E_F$, and $E_A$ represents various energy levels of the p-doped material of n-channel transistor 12. Specifically, $E_V$ represents the energy level of the valence band that contains valence electrons, $E_C$ represents the energy level of the conduction band that contains conduction electrons, $E_F$ represents the Fermi energy level, and $E_A$ represents the energy level of an acceptor (a p-dopant). Thus, for an n-channel transistor, the energy level of the acceptor is closer to the valence band.

The desired ionized impurity concentration for n-channel transistor 12, $N_A^*$, can be estimated by:

$$N_A^* = \frac{N_A}{1 + 4\exp\left(\frac{E_A - E_F}{kT}\right)}$$

where $N_A$ is the doping concentration of the acceptor, k is Boltzmann's constant, and T is the absolute temperature. The equation for the threshold voltage of n-channel transistor 12 is given by:

$$V_{TH_N} = V_{FB} + 2\psi_{BN} + \frac{2\sqrt{e\epsilon_s N_A^* \psi_{BN}}}{C_i}$$

where $V_{FB}$ is the flat-band voltage (or the difference in work function between the gate material and the channel material), $\psi_{BN}$ is the band-bending at the surface of n-channel transistor 12, e is the electronic charge ($1.6 \times 10^{-19}$ C), $\epsilon_s$ is the dielectric constant of silicon, $N_A^*$ is the estimated ionized doping concentration of the acceptor (i.e., the p-dopant), and $C_i$ is the gate oxide capacitance per unit area.

With reference now to FIG. 2b, there is illustrated an energy band diagram of the n-doped material of p-channel transistor 11, according to the prior art. Similar to FIG. 2a, $E_V$ represents the energy level of the valence band, $E_C$ represents the energy level of the conduction band, $E_F$ represents the Fermi energy level, and $E_D$ represents the energy level of a donor (an n-dopant). Thus, for a p-channel transistor, the energy level of the donor is closer to the conduction band.

The desired ionized impurity concentration for p-channel transistor 11 can be estimated by:

$$N_D^* = \frac{N_D}{1 + 2\exp\left(\frac{E_F - E_D}{kT}\right)}$$

where $N_D$ is the doping concentration of the donor, k is Boltzmann's constant, and T is the absolute temperature. The equation for the threshold voltage of p-channel transistor 11 is given by:

$$V_{TH_P} = V_{FB} + 2\psi_{BP} + \frac{2\sqrt{e\epsilon_s N_D^* \psi_{BP}}}{C_i}$$

where $V_{FB}$ is the flat-band voltage, $\psi_{BP}$ is the band-bending at the surface of p-channel transistor 11, e is the electronic charge, $\epsilon_S$ is the dielectric constant of silicon, $N_D^*$ is the ionized doping concentration of the donor (i.e., the n-dopant), and $C_i$ is the gate oxide capacitance per unit area.

Referring now to FIG. 3a, there is illustrated an energy band diagram of the double p-doped material of n-channel transistor 12, in accordance with a preferred embodiment of the present invention. As shown, $E_V$ represents the energy level of the valence band, $E_C$ represents the energy level of the conduction band, $E_F$ represents the Fermi energy level, $E_{A1}$ represents the energy level of a first acceptor, and $E_{A2}$ represents the energy level of a second acceptor. As shown, at room temperature, the energy level of the first acceptor is closer to the valence band, and the energy level of the second acceptor is closer to the conduction band.

The desired ionized impurity concentration for double p-doped n-channel transistor 12 can be estimated by:

$$N_{A1}^* = \frac{N_{A1}}{1 + 4\exp\left(\frac{E_{A1} - E_F}{kT}\right)}$$

$$N_{A2}^* = \frac{N_{A2}}{1 + 4\exp\left(\frac{E_{A2} - E_F}{kT}\right)}$$

where $N_{A1}$ is the impurity concentration of the fully ionized first acceptor and $N_{A2}$ is the impurity concentration of the fully ionized second acceptor. At low temperatures, such as room temperature, the ionized impurity concentration is close to the impurity concentration of the fully ionized first acceptor (i.e., $N_A^* \approx N_{A1}$). However, at higher temperatures, such as 140° C., the total ionized impurity concentration for double p-doped n-channel transistor 12 is the sum of the impurity concentration of the fully ionized first acceptor and the impurity concentration of the fully ionized second acceptor (i.e., $N_A^* = N_{A1} + N_{A2}$).

The equation for threshold voltage of double p-doped n-channel transistor 12 at high temperatures is given by:

$$V_{TH_N} = V_{FB} + 2\psi_{BN} + \frac{2\sqrt{e\epsilon_s(N_{A1}^* + N_{A2}^*)\psi_{BN}}}{C_i}$$

where $V_{FB}$ is the flat-band voltage, $\psi_{BN}$ is the band-bending at the surface of n-channel transistor 12, e is the electronic charge, $\epsilon_S$ is the dielectric constant of silicon, $N_{A1}^*$ is the doping concentration of a first acceptor, $N_{A2}^*$ is the estimated doping concentration of a second acceptor, and $C_i$ is the gate oxide capacitance per unit area.

The change in threshold voltage in double p-doped n-channel transistor 12 can be described by:

$$\Delta V_{TH_N}' \approx \frac{2\sqrt{e\epsilon_s \psi_{BN}}}{C_i} \left(\sqrt{N_{A1}^* + N_{A2}^*} - \sqrt{N_{A1}^*}\right)$$

Referring now to FIG. 3b, there is illustrated an energy band diagram of a double n-doped material of p-channel transistor 11, in accordance with a preferred embodiment of the present invention. As shown, $E_V$ represents the energy level of the valence band, $E_C$ represents the energy level of the conduction band, $E_F$ represents the Fermi energy level, $E_{D1}$ represents the energy level of a first donor, and $E_{D2}$ represents the energy level of a second donor. Thus, at room temperature, the energy level of the first donor is closer to the conduction band, and the energy level of the second donor is closer to the valence band.

The desired ionized impurity concentration for double n-doped p-channel transistor 11 can be estimated by:

$$N_{D1}^* = \frac{N_{D1}}{1 + 2\exp\left(\frac{E_F - E_{D1}}{kT}\right)}$$

$$N_{D2}^* = \frac{N_{D2}}{1 + 2\exp\left(\frac{E_F - E_{D2}}{kT}\right)}$$

where $N_{D1}$ is the impurity concentration of the fully ionized first donor dopants and $N_{D2}$ is the impurity concentration of the fully ionized second donor dopants. At low temperatures, such as room temperature, the impurity concentration of the fully ionized donor dopants is about the same as the impurity concentration of the fully ionized first donor dopants (i.e., $N_D^* \approx N_{D1}$). However, at higher temperatures, such as 140° C., the total ionized impurity concentration for double n-doped p-channel transistor 11 is the sum of the impurity concentration of the fully ionized first donor dopants and the impurity concentration of the fully ionized second donor dopants (i.e., $N_D^* = N_{D1} + N_{D2}$).

The equation for threshold voltage of double n-doped p-channel transistor 11 is given by:

$$V_{TH_P} = V_{FB} + 2\psi_{BP} + \frac{2\sqrt{e\epsilon_s(N_{D1}^* + N_{D2}^*)\psi_{BP}}}{C_i}$$

where $V_{FB}$ is the flat-band voltage, $\psi_{BP}$ is the band-bending at the surface of p-channel transistor 11, e is the electronic charge, $\epsilon_S$ is the dielectric constant of silicon, $N_{D1}^*$ is the doping concentration of a first donor, $N_{D2}^*$ is the estimated doping concentration of a second donor, and $C_i$ is the gate oxide capacitance per unit area.

The change in threshold voltage in double n-doped p-channel transistor 11 can be described by the equation below:

$$\Delta V_{TH_P} \approx \frac{2\sqrt{e\epsilon_s \psi_{BP}}}{C_i} \left( \sqrt{N_{DI}^* + N_{D2}^*} - \sqrt{N_{DI}^*} \right)$$

In a preferred embodiment, double p-doped n-channel transistor 12 is doped with a first dopant, such as Boron, and a second dopant, such as Platinum. Boron has an ionization energy of 0.045 eV above the valence band $E_V$, and Platinum has an ionization energy of 0.25 eV below the conduction band $E_C$. Boron and Platinum are merely illustrative of elements which could be utilized as dopants to create the present invention. Many other elements, such as Magnesium or Cadmium, could also be utilized without departing from the scope of the present invention.

As for double n-doped p-channel transistor 11, the first electron donor energy level $E_{D1}$ can be attained by doping silicon with Phosphorous. The second electron donor energy level $E_{D2}$ can be attained by utilizing Carbon, Platinum, or Gold. Again, phosphorous, carbon, and platinum are merely illustrative of elements that can be utilized as dopants for the present invention.

Figure 4:
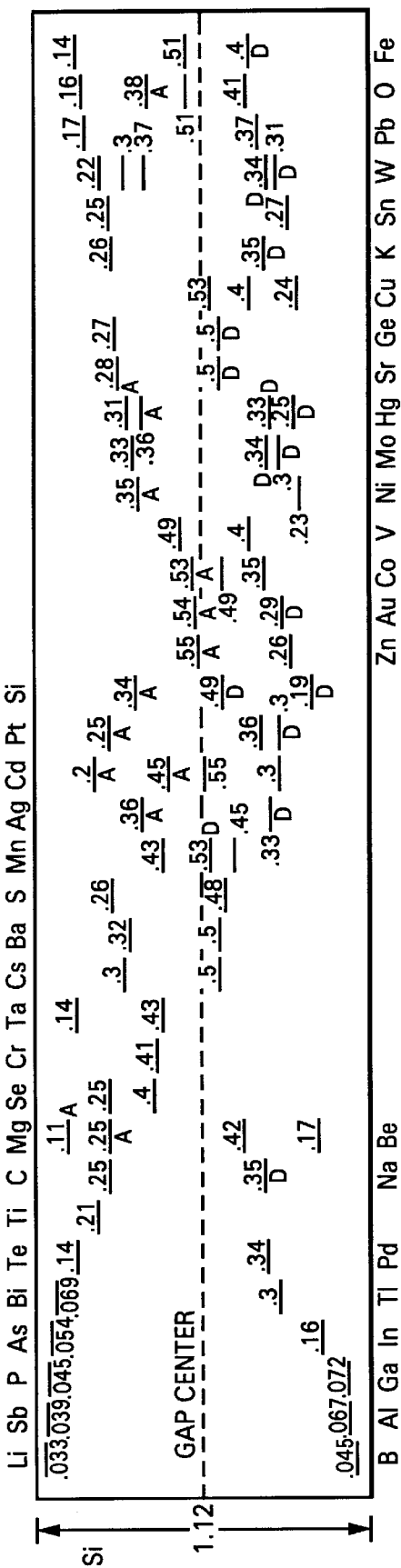
FIG. 4 is a chart of elements that are good candidates for use as partially ionized dopants according to the present invention.

With reference now to FIG. 4, there is illustrated a chart of ionization energies of different dopants in silicon. If an element has an ionization energy in silicon that is below the band gap center and has a "D" associated with its stated ionization energy, then the element is a good candidate for use as the second donor donor. Alternatively, if an element has an ionization energy in silicon that is above the band gap energy and has an "A" associated with its stated ionization energy, then the element is a good candidate for use as the second acceptor.

As has been described, the present invention provides an improved method for fabricating a transistor having an variable threshold voltage. The introduction of partially ionized dopants into a MOS transistor can increase the threshold voltage of the MOS transistor at higher temperatures and while allowing lower threshold voltages at lower temperatures. During high temperature operations, the threshold voltage of a MOS transistor remains high because extra dopants within the body and channels of the MOS transistor are ionized.

While the invention has been particularly shown and described with reference to a preferred embodiment, it will be understood by those skilled in the art that various changes in form and detail may be made therein without departing from the spirit and scope of the invention.

What is claimed is:

1. A method for fabricating a transistor having a variable threshold voltage, wherein energy levels of said transistor can be represented by a valance band, a conduction band, and a Fermi level, said method comprising the steps of:
    doping a region of said transistor with a first dopant having a first energy level below said Fermi level; and
    doping said region of said transistor with a second dopant having a second energy level above said Fermi level, wherein said second dopant is of a same impurity type as said first dopant.

2. The method according to claim 1, wherein said transistor is an n-channel transistor.

3. The method according to claim 1, wherein said region is a p-doped region.

4. The method according to claim 1, wherein said first dopant is an acceptor.

5. The method according to claim 1, wherein said first dopant is Boron.

6. The method according to claim 1, wherein said second dopant is an acceptor.

7. The method according to claim 1, wherein said second dopant is one of following elements: Platinum, Magnesium, or Cadmium.

8. A method for fabricating a transistor having a variable threshold voltage, wherein energy levels of said transistor can be represented by a valance band, a conduction band, and a Fermi level, said method comprising the steps of:
    doping a region of said transistor with a first dopant having a first energy level above said Fermi level; and
    doping said region of said transistor with a second dopant having a second energy level below said Fermi level, wherein said second dopant is of a same impurity type as said first dopant.

9. The method according to claim 8, wherein said transistor is a p-channel transistor.

10. The method according to claim 8, wherein said region is an n-doped region.

11. The method according to claim 8, wherein said first dopant is an donor.

12. The method according to claim 8, wherein said first dopant is Phosphorous.

13. The method according to claim 8, wherein said second dopant is a donor.

14. The method according to claim 8, wherein said second dopant is one of following elements: Platinum, Gold, or Carbon.

* * * * *